United States Patent [19]
Ozimek et al.

[11] Patent Number: 5,865,935
[45] Date of Patent: *Feb. 2, 1999

[54] METHOD OF PACKAGING IMAGE SENSORS

[75] Inventors: Edward J. Ozimek, Penfield; Terry Tarn, Pittsford, both of N.Y.

[73] Assignee: Eastman Kodak Company, Rochester, N.Y.

[ * ] Notice: The term of this patent shall not extend beyond the expiration date of Pat. No. 5,382,310.

[21] Appl. No.: 847,549

[22] Filed: Apr. 23, 1997

Related U.S. Application Data

[63] Continuation of Ser. No. 382,561, Feb. 2, 1995.

[51] Int. Cl.⁶ ........................................................ H05K 3/00
[52] U.S. Cl. ........................................ 156/303.1; 156/298
[58] Field of Search ................................. 156/303.1, 298

[56] References Cited

U.S. PATENT DOCUMENTS

| | | | |
|---|---|---|---|
| 4,925,708 | 5/1990 | Waters et al. | 156/292 X |
| 4,927,493 | 5/1990 | Yamazaki et al. | 156/292 X |

*Primary Examiner*—Francis J. Lorin
*Attorney, Agent, or Firm*—James D. Leimbach

[57] ABSTRACT

A method of packaging image sensors using an optical grade adhesive and cover plate over the image sensor.

5 Claims, 1 Drawing Sheet

METHOD OF PACKAGING IMAGE SENSORS

This is a Continuation of application Ser. No. 08/382,561, filed 02 Feb. 1995.

FIELD OF THE INVENTION

The present invention relates to forming packages for an image sensor which are particularly suitable for medical applications.

BACKGROUND OF THE INVENTION

Small conventional solid-state image sensors are mounted on an insertion probe and are used in medical applications. In such arrangements frequently the image sensor is formed in a ceramic package body and then the ceramic package body is secured to a lead frame by an adhesive. (See for example, U.S. Pat. No. 5,098,630 issued Mar. 24, 1992 to Ogiu et al.)

In these arrangements it is very difficult to package image sensors for use in medical applications by conventional means and obtain a small, minimally invasive size needed for best performance. The sidewalls of the traditional ceramic package body often add to the overall dimensions of the final product.

SUMMARY OF THE INVENTION

It is an object of the present invention to provide an improved method for securing image sensors to a ceramic member. In order to reduce their size, another object of the present invention is to provide an improved method for packaging image sensors which are suitable for use in medical applications.

These objects are achieved by a method of packaging an image sensor comprising:
- a) attaching a die (image sensor) to a preformed ceramic member;
- b) providing electrical connections between the die and ceramic member;
- c) placing a cover glass over the upper surface of the ceramic member in registry with the die;
- d) filling in voids between the die and the cover glass with an adhesive selected so that its index of refraction is matched to that of the cover glass and has predetermined mechanical and thermal properties; and
- e) curing the adhesive insitu.

This object is further achieved in a method of packaging a medical image sensor, comprising:
- (a) securing a die (image sensor) to preformed ceramic member;
- (b) providing electrical connections between the ceramic member and the die;
- (c) forming an optically transparent curable adhesive over the die, such adhesive having a selected index of refraction and having predetermined mechanical and thermal properties,
- (d) curing such adhesive so that the top surface of the adhesive over the die has a concave topography;
- (e) filling in the concave topography with curable adhesive;
- (f) placing a cover glass over the filled in adhesive, such cover glass having an index of refraction matched to the filled in adhesive; and
- (g) exposing the filled in adhesive with light illuminated through the cover glass to such cured filled in adhesive and thereby secure the cover glass to the filled in adhesive.

Advantages

An advantage of this invention is that the assemblage of ceramic members, die and electrical connections (typically, wire bonds), curable adhesives, and a cover glass produce a package having good structural properties.

Another advantage of this invention is that the cover glass, which is indexed matched to the adhesive provides an optically sound top protective surface. The cured adhesive provides a good moisture barrier, good sidewall strength, protection for the delicate components, and a good optical path for image detection purposes.

A package in accordance with the present invention provides the smallest possible diameter available to adequately house the image sensor. The integrity of the package is excellent. A high quality optical adhesive provides good support and adhesion to the cover glass as well as an excellent optical path. This package is suitable for medical imaging requirements because it provides a minimally invasive size. This type of encapsulation is superior in its optical quality as compared to a plastic, molded package. Other features of this invention include (1) providing a packaging arrangement for the basic components of an image sensor assembly which has a minimal size, (2) being able to create a protective surrounding medium with excellent optical properties by using the proper adhesive, (3) building the encapsulating volume by using more than one application of the optical adhesive to the cavity thus compensating for gross volumetric shrinkage, and (4) centering and attaching of the cover plate by free floating the cover glass on the uppermost layer of adhesive.

DETAILED DESCRIPTION OF THE PREFERRED EMBODIMENTS

Figure 1:
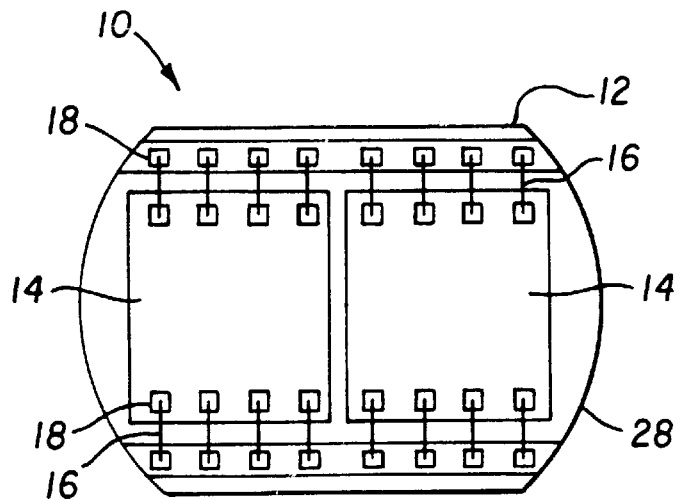
FIG. 1 is a plan view of an ceramic member with two dies or image sensors mounted in such member and with associated wire bond connections.

Turning now to FIG. 1, there is shown a package 10 for an image sensor or die 14. In fact there are two dies shown which would be suitable in stereoscopic application. The package further includes a ceramic body 12 bonding pads 18 provided on both the ceramic body 12 and die 14 and wire bonds 16 electrically connecting the die 14 to the ceramic package to pinouts 22. These pinouts are shown in FIG. 2.

Figure 2:
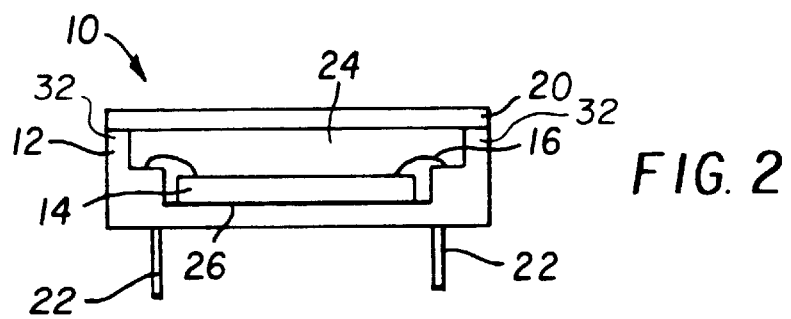
FIG. 2 is a schematic side view of the package shown in FIG. 1.

In FIG. 2 a side view of the package 10 is shown to include a cover glass 20 disposed on top of the ceramic body 12. Examples of such glass are Corning 7059, baria alumina borosilicate, made by Corning Inc., of Corning, N.Y. The wire bonds 16 are connected to conductor portions such as typically gold plated structure which in turn is connected to the pinouts 22. This arrangement is conventional and not shown. As shown in FIG. 2, the die 14 is attached to the ceramic body 12 by conductive adhesive 26. This adhesive is preferably heat curable and can be filled with silver to improve its conductivity. Examples of such adhesive that can be suitable for use with the present invention are Epotek 410-E, made by Epoxy Technologies, Inc., of Billerica, Mass.

Filling the void with an appropriate optical grade adhesive 24 will ensure a good seal as well as maintain an excellent imaging performance. The choice of adhesive and the manner of application is very important. Optical adhesives will shrink volumetrically when they are cured. This, in turn, can stress the components of the package mechanically as well as pull away and create optical coupling problems. A weak link of the package is the cover glass 20. As shown in FIG. 1 the package has a radiused end 28. This is advantageous in that it further reduces size and also makes insertion easier. However, the radiused end also creates stress and the potential for cracking. This is especially true if the edges need to be trimmed to fit the package into its carrier. In order to eliminate the trimming concerns, the cover glass 20 is made slightly undersized when compared to the outer dimensions of the ceramic body 12. Also, any adhesive shrinkage which creates a small volume at the outermost edges is not filled with adhesive, thereby eliminating the source of the trimming problem.

Two methods can be used for the sealing process. The first utilizes a cover glass 20 which has been attached to the uppermost part top surface 32 of the ceramic body 12 by means of a heat curable adhesive. The cover glass 20 may or may not have additional coatings on it such as anti-reflection layers, infrared filtering, etc. In this case there is a volume which has the underside of the cover glass 20 as its uppermost boundary. Holding the package on end with the open ends vertically aligned, optical adhesive is applied at the uppermost opening and allowed to flow by means of gravity into the void. Since the volume is small, a limited number of drops of the adhesive will have enough volume to completely fill the void in the package. The surface tension of the cover glass 20, ceramic body 12, and die 14 are sufficient to "hold" the adhesive and keep it from falling through the void. If there is gas or debris entrapment, additional adhesive will flush out the unwanted objects from the bottom side. Once the quality of the adhesive (free of debris and gas entrapment) is acceptable, the package can be positioned horizontally and cured. Typically the adhesive will be a thermal adhesive which has an index of refraction matched to that of the cover glass 20 and an acceptable mechanical and thermal properties. An example of such adhesive is Epotek 301-2 made by Epoxy Technologies, Inc., of Billercia, Mass. The results of this process is that the die 14 will be protected from moisture and debris and be able to receive suitable good optical response.

Figure 3:
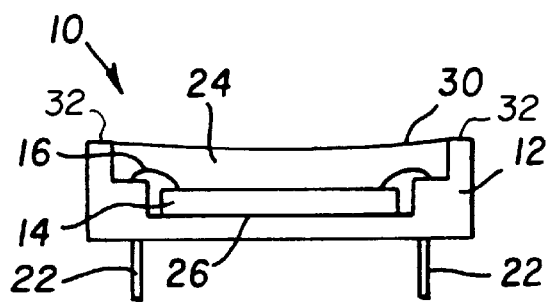
FIG. 3 is a view of another package embodiment during the process of its assembly.

In a second process which is illustrated in FIG. 3, the ceramic body 12 with the die 14 and the wire bonds 16 in place are held in a fixture which is built to conform to the outer radius of the ceramic body 12 (fixture not shown). Forming a wall, the fixture creates a well which can be filled with the adhesive. Since the adhesive shrinks upon curing, a multiple layer approach is preferred. The void is filled initially such that the adhesive comes to the top surface 32 of the ceramic body 12. When cured, a concave surface (concave topography) 30 is formed in the central part of the top surface of the adhesive due to volumetric shrinking. The package is removed from the fixture at this point. The package is held horizontally and the concave surface 30 is filled with a small amount of similar adhesive such that a small bulge shows on the top. The cover glass 20 is carefully placed on top of the package. It is found that a self-centering of the window takes place over the assemblage below. Minor adjustments for positioning can be made easily. Once the desired position is attained, the unexposed adhesive can be cured. Since only a small amount of adhesive needs to be crosslinked, the amount of shrinkage is minimal, and the resultant stress on the window is reduced greatly. Preferably, the present invention envisions forming an optically transparent UV curable adhesive over the die 14, such adhesive having a selected index of refraction and having predetermined mechanical and thermal properties. The adhesive is then cured by exposing the filled in adhesive with UV light illuminated through the cover glass to such cured filled in adhesive, thereby, securing the cover glass to the filled in adhesive. At this point the package is complete. The package is ready for assembly into the final product. The package, of course, is similar to that as shown in FIG. 2. Examples of UV curable adhesive which are suitable for use in the following invention are DYMAX 401 and DYMAX 488 of DYMAX Corporation, Torrington, Conn.

It is envisioned that adhesives that are both UV and thermally curable be employed within the context of the foregoing embodiments of the present invention.

The invention has been described in detail with particular reference to certain preferred embodiments thereof, but it will be understood that variations and modifications can be effected within the spirit and scope of the invention.

Parts List 10 image sensor
12 ceramic body
14 die
16 wire bonds
18 bond pads
20 cover glass
22 pinouts
24 optical grade adhesive
26 silver filled adhesive
28 radiused end
30 concave surface

We claim:

1. A method of packaging an image sensor comprising:
a) attaching a die (image sensor) to a preformed ceramic member such that a void exists between a top surface of the preformed ceramic member and the die;
b) providing electrical connections between the die and ceramic member;
c) placing a cover glass over the upper surface of the ceramic member in registry with the die such that the void is preserved;
d) filling in the void between the die and the cover glass with an adhesive selected so that its index of refraction is matched to that of the cover glass and has predetermined mechanical and thermal properties; and
e) curing the adhesive in situ.

2. The method as set forth in claim 1 wherein the curing step is accomplished by thermally curing in an oven.

3. A method of claim 1 wherein the step of filling in the void is performed prior to the step of placing the cover glass over the top surface of the ceramic member.

4. A method of packaging a medical image sensor, comprising:
(a) securing a die (image sensor) within a recess of a ceramic member that has a top surface that is higher than the die within the recess, such that there is a void between the die and the top surface;

(b) providing electrical connections between the ceramic member and the die;

(c) forming an optically transparent UV curable adhesive over the die, the adhesive having a selected index of refraction and having predetermined mechanical and thermal properties, (d) curing the adhesive so that it does not rise above the top surface of the ceramic member and the adhesive over the die has a concave topography;

(e) filling in the concave topography with the curable adhesive and any remaining portions of the void;

(f) placing a cover glass over the void filled with adhesive, the cover glass having an index of refraction matched to the adhesive; and (g) exposing the void filled with adhesive to UV light illuminated through the cover glass to the adhesive and thereby secure the cover glass to the adhesive.

5. The method of claim 4 wherein the adhesive is thermally curable.

* * * * *